United States Patent
Wang et al.

(10) Patent No.: US 7,812,430 B2
(45) Date of Patent: Oct. 12, 2010

(54) LEADFRAME AND SEMICONDUCTOR PACKAGE HAVING DOWNSET BAFFLE PADDLES

(75) Inventors: Chin-Fa Wang, Hsinchu (TW);
Wan-Jung Hsieh, Hsinchu (TW);
Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 476 days.

(21) Appl. No.: 12/042,125

(22) Filed: Mar. 4, 2008

(65) Prior Publication Data
US 2009/0224380 A1    Sep. 10, 2009

(51) Int. Cl.
*H01L 23/495* (2006.01)
(52) U.S. Cl. .............. 257/670; 257/E21.502; 257/690; 257/675; 257/796; 257/711; 257/712; 438/123
(58) Field of Classification Search .......... 257/670, 257/E21.502, 690, 667, 675, 796, 711, 712; 438/123
See application file for complete search history.

(56) References Cited

U.S. PATENT DOCUMENTS

| | | | | |
|---|---|---|---|---|
| 5,177,032 A | * | 1/1993 | Fogal et al. .............. 228/175 |
| 5,197,183 A | * | 3/1993 | Chia et al. .............. 29/827 |
| 5,218,229 A | * | 6/1993 | Farnworth .............. 257/676 |
| 5,249,354 A | * | 10/1993 | Richman .............. 29/827 |
| 5,327,008 A | * | 7/1994 | Djennas et al. .............. 257/666 |
| 5,381,037 A | * | 1/1995 | Olivarez .............. 257/666 |
| 5,424,576 A | * | 6/1995 | Djennas et al. .............. 257/666 |
| 5,429,992 A | * | 7/1995 | Abbott et al. .............. 29/827 |
| 5,430,331 A | * | 7/1995 | Hamzehdoost et al. ...... 257/796 |
| 5,446,959 A | * | 9/1995 | Kim et al. .............. 29/827 |
| 5,459,103 A | * | 10/1995 | Kelleher et al. .............. 205/125 |
| 5,506,446 A | * | 4/1996 | Hoffman et al. .............. 257/674 |
| 5,521,428 A | * | 5/1996 | Hollingsworth et al. ...... 257/670 |
| 5,539,251 A | * | 7/1996 | Iverson et al. .............. 257/670 |
| 5,554,886 A | * | 9/1996 | Song .............. 257/666 |
| 5,612,853 A | * | 3/1997 | Kim et al. .............. 361/723 |
| 5,633,528 A | * | 5/1997 | Abbott et al. .............. 257/666 |
| 5,683,944 A | * | 11/1997 | Joiner et al. .............. 438/122 |
| 5,708,293 A | * | 1/1998 | Ochi et al. .............. 257/666 |
| 5,729,049 A | * | 3/1998 | Corisis et al. .............. 257/666 |
| 5,744,827 A | * | 4/1998 | Jeong et al. .............. 257/686 |
| 5,807,767 A | * | 9/1998 | Stroupe .............. 438/123 |
| 5,822,848 A | * | 10/1998 | Chiang .............. 438/106 |
| 5,834,836 A | * | 11/1998 | Park et al. .............. 257/686 |
| 5,836,454 A | * | 11/1998 | Evers .............. 206/723 |
| 5,872,395 A | * | 2/1999 | Fujimoto .............. 257/675 |
| 5,889,318 A | * | 3/1999 | Corisis .............. 257/670 |
| 5,914,528 A | * | 6/1999 | Takiar et al. .............. 257/666 |
| 5,914,529 A | * | 6/1999 | King et al. .............. 257/666 |
| 5,915,166 A | * | 6/1999 | Corisis et al. .............. 438/106 |
| 5,929,514 A | * | 7/1999 | Yalamanchili .............. 257/676 |

(Continued)

*Primary Examiner*—Fernano L Toledo
*Assistant Examiner*—Ankush K Singal
(74) *Attorney, Agent, or Firm*—Muncy, Geissler, Olds & Lowe, PLLC

(57) ABSTRACT

A lead frame with downset baffle paddles and a semiconductor package utilizing the same are revealed. The lead frame primarily comprises a plurality of leads formed on a first plane, a baffle paddle formed on a second plane in parallel, and an internal tie bar formed between the first plane and the second plane. The internal tie bar has at least two or more windings such as "S" shaped to flexibly connect the baffle paddle to an adjacent one of the leads. Therefore, the internal tie bar can reduce the shifting and twisting of the connected lead during the formation of the downset of the baffle paddle.

18 Claims, 5 Drawing Sheets

U.S. PATENT DOCUMENTS

| | | | | |
|---|---|---|---|---|
| 5,945,729 A * | 8/1999 | Stroupe | ................ | 257/666 |
| 5,952,711 A * | 9/1999 | Wohlin et al. | ................ | 257/668 |
| 5,996,805 A * | 12/1999 | Evers | ................ | 206/723 |
| 6,008,073 A * | 12/1999 | King et al. | ................ | 438/123 |
| 6,028,350 A * | 2/2000 | Sabyeying | ................ | 257/670 |
| 6,046,496 A * | 4/2000 | Corisis et al. | ................ | 257/675 |
| 6,065,381 A * | 5/2000 | Kim et al. | ................ | 83/98 |
| 6,069,028 A * | 5/2000 | Stroupe | ................ | 438/123 |
| 6,072,228 A * | 6/2000 | Hinkle et al. | ................ | 257/666 |
| 6,075,283 A * | 6/2000 | Kinsman et al. | ................ | 257/676 |
| 6,078,099 A * | 6/2000 | Liu et al. | ................ | 257/676 |
| 6,091,133 A * | 7/2000 | Corisis et al. | ................ | 257/666 |
| 6,093,957 A * | 7/2000 | Kwon | ................ | 257/666 |
| 6,111,307 A * | 8/2000 | Corisis | ................ | 257/666 |
| 6,140,154 A * | 10/2000 | Hinkle et al. | ................ | 438/123 |
| 6,143,589 A * | 11/2000 | Corisis et al. | ................ | 438/118 |
| 6,157,074 A * | 12/2000 | Lee | ................ | 257/666 |
| 6,215,177 B1 * | 4/2001 | Corisis et al. | ................ | 257/666 |
| 6,225,683 B1 * | 5/2001 | Yalamanchili et al. | ...... | 257/666 |
| 6,239,487 B1 * | 5/2001 | Park et al. | ................ | 257/712 |
| 6,246,110 B1 * | 6/2001 | Kinsman et al. | ................ | 257/672 |
| 6,256,200 B1 * | 7/2001 | Lam et al. | ................ | 361/704 |
| 6,258,629 B1 * | 7/2001 | Niones et al. | ................ | 438/111 |
| 6,265,761 B1 * | 7/2001 | Ghai | ................ | 257/666 |
| 6,278,175 B1 * | 8/2001 | James | ................ | 257/666 |
| 6,300,165 B2 * | 10/2001 | Castro | ................ | 438/118 |
| 6,303,984 B1 * | 10/2001 | Corisis | ................ | 257/670 |
| 6,307,254 B1 * | 10/2001 | Stroupe | ................ | 257/666 |
| 6,309,913 B1 * | 10/2001 | Stroupe | ................ | 438/123 |
| 6,339,252 B1 * | 1/2002 | Niones et al. | ................ | 257/666 |
| 6,362,022 B1 * | 3/2002 | Hinkle et al. | ................ | 438/123 |
| 6,414,379 B1 * | 7/2002 | Chang et al. | ................ | 257/666 |
| 6,448,633 B1 * | 9/2002 | Yee et al. | ................ | 257/666 |
| 6,451,629 B2 * | 9/2002 | James | ................ | 438/124 |
| 6,452,802 B2 * | 9/2002 | Lam et al. | ................ | 361/704 |
| 6,472,725 B1 * | 10/2002 | Stroupe | ................ | 257/666 |
| 6,476,471 B1 * | 11/2002 | Buck, Jr. | ................ | 257/678 |
| 6,483,177 B1 * | 11/2002 | Yee | ................ | 257/670 |
| 6,555,899 B1 * | 4/2003 | Chung et al. | ................ | 257/670 |
| 6,563,201 B1 * | 5/2003 | Golz | ................ | 257/672 |
| 6,570,244 B1 * | 5/2003 | Hinkle et al. | ................ | 257/666 |
| 6,603,195 B1 * | 8/2003 | Caletka et al. | ................ | 257/670 |
| 6,610,561 B2 * | 8/2003 | Tsubosaki et al. | ................ | 438/123 |
| 6,611,048 B1 * | 8/2003 | Fazelpour et al. | ................ | 257/670 |
| 6,646,339 B1 * | 11/2003 | Ku et al. | ................ | 257/708 |
| 6,677,662 B1 * | 1/2004 | Chung et al. | ................ | 257/666 |
| 6,713,836 B2 * | 3/2004 | Liu et al. | ................ | 257/528 |
| 6,815,833 B2 * | 11/2004 | Lee et al. | ................ | 257/778 |
| 6,825,062 B2 * | 11/2004 | Yee et al. | ................ | 438/106 |
| 6,831,352 B1 * | 12/2004 | Tsai | ................ | 257/666 |
| 6,838,753 B2 * | 1/2005 | Lee et al. | ................ | 257/666 |
| 6,902,952 B2 * | 6/2005 | Hinkle et al. | ................ | 438/107 |
| 6,946,722 B2 * | 9/2005 | Hinkle et al. | ................ | 257/666 |
| 7,057,280 B2 * | 6/2006 | Yee et al. | ................ | 257/730 |
| 7,135,763 B2 * | 11/2006 | Stroupe | ................ | 257/690 |
| 7,192,809 B2 * | 3/2007 | Abbott | ................ | 438/123 |
| 7,321,160 B2 * | 1/2008 | Hinkle et al. | ................ | 257/666 |
| 7,368,807 B2 * | 5/2008 | Abbott | ................ | 257/676 |
| 7,556,987 B2 * | 7/2009 | Dimaano et al. | ................ | 438/123 |
| 7,564,122 B2 * | 7/2009 | Yee et al. | ................ | 257/666 |
| 7,576,416 B2 * | 8/2009 | Tu et al. | ................ | 257/669 |
| 7,576,418 B2 * | 8/2009 | Chen et al. | ................ | 257/670 |
| 2001/0042912 A1 * | 11/2001 | Huang | ................ | 257/690 |
| 2001/0053566 A1 * | 12/2001 | James | ................ | 438/123 |
| 2002/0076857 A1 * | 6/2002 | Hinkle et al. | ................ | 438/123 |
| 2002/0109215 A1 * | 8/2002 | Iwaya et al. | ................ | 257/676 |
| 2002/0140064 A1 * | 10/2002 | Wu et al. | ................ | 257/670 |
| 2002/0167074 A1 * | 11/2002 | Kim | ................ | 257/666 |
| 2003/0011006 A1 * | 1/2003 | Yee | ................ | 257/200 |
| 2003/0020146 A1 * | 1/2003 | Yee et al. | ................ | 257/666 |
| 2003/0116833 A1 * | 6/2003 | Lee et al. | ................ | 257/666 |
| 2003/0205790 A1 * | 11/2003 | Hinkle et al. | ................ | 257/670 |
| 2004/0061217 A1 * | 4/2004 | Ku et al. | ................ | 257/708 |
| 2006/0189037 A1 * | 8/2006 | Abbott | ................ | 438/123 |
| 2007/0155058 A1 * | 7/2007 | Jereza | ................ | 438/123 |
| 2007/0164402 A1 * | 7/2007 | Jung et al. | ................ | 257/666 |
| 2007/0164405 A1 * | 7/2007 | Abbott | ................ | 257/666 |
| 2008/0128741 A1 * | 6/2008 | Li et al. | ................ | 257/99 |
| 2008/0188039 A1 * | 8/2008 | Chiou et al. | ................ | 438/123 |
| 2009/0121329 A1 * | 5/2009 | Chen et al. | ................ | 257/670 |
| 2009/0224380 A1 * | 9/2009 | Wang et al. | ................ | 257/670 |
| 2010/0001385 A1 * | 1/2010 | Caparas et al. | ................ | 257/676 |

\* cited by examiner

LEADFRAME AND SEMICONDUCTOR PACKAGE HAVING DOWNSET BAFFLE PADDLES

FIELD OF THE INVENTION

The present invention relates to an electrically connecting carrier for semiconductor packages, especially to a lead frame with downset baffle paddles and a semiconductor package utilizing the lead frame.

BACKGROUND OF THE INVENTION

Lead frames as chip carriers are widely implemented in semiconductor packages. Normally, the lead frame is completely made of metal having a plurality of metal leads and a baffle paddle where the metal leads are for electrical connections of the chip and the baffle paddle is configured to change the mold flows of molding compounds and further to balance the top and bottom mold flow to manufacture good quality encapsulant for encapsulating the chip. In a conventional lead frame-based semiconductor package, Lead-On-Chip, LOC, the leads can replace die pads for die attachment. However, in order to balance the top and bottom mold flow during encapsulation, the baffle paddle is adjusted to be "downset" in a different plane as the leads whether using chip carriers with die pads or LOC leads. Therefore, the connections of the baffle paddle have to be bent causing shifting and twisting of the corresponding connected leads leading to inaccurate die attachment and wire-bonding difficulties.

As shown in FIG. 1, a conventional lead frame 100 primarily comprises a plurality of leads 110, at least a baffle paddle 120, and a plurality of internal tie bars 130. The leads 110 are disposed at two opposing longer sides of the lead frame 100 and the baffle paddles 120 are disposed at two opposing shorter sides of the lead frame 100. The baffle paddies 120 are connected to a dam frame 140 of the lead frame 100 by a plurality of external tie bars 121 and is also connected to an adjacent one 111 of the lead 110 by the internal tie bar 130 to prevent the baffle paddle 120 from shifting during molding. The internal tie bar 130 is completely encapsulated in a semiconductor package, but the external tie bars 121 have one ends exposed from the semiconductor package. Before semiconductor packaging processes, the leads 110, 111, and the baffle paddle 120 are integrally connected and firmly held to the dam frame 140. As shown in FIG. 2 and FIG. 3, when a downset is formed on the internal tie bar 130 and the external tie bars 121 to make the baffle paddle 120 downset with respect to the leads 110, a downset bend 131 having creases is formed between the internal tie bar 130 and the baffle paddle 120 so that the leads 110 are formed on the first plane 101 and the baffle paddle 120 on the second plane 102 in parallel, respectively. As shown in FIG. 2, the internal tie bar 130 experiences a force pulling downward to create a shifting displacement D1 and to twist the connected lead 111 to create a twisting displacement D2 when forming the downset bend 131. A die-attaching tape 150 is attached to the bottom surfaces of the leads 110 including the lead 111 for attaching a chip, not shown in the figure. As shown in FIG. 2 and FIG. 3, since the lead 111 is pulled and twisted with the twisting displacement D2 so that lead 111 can not be in the same plane as the rest of the leads 110, therefore, the die-attaching tape 150 can not completely attach to the active surface of a chip. Therefore, the die-attaching tape 150 can not closely attach to the chip during die-attaching processes, the bonding strengths between the chip and the leads 110, 111 are reduced leading to easily peeling of the chip. Moreover, the twisting displacement D2 of the lead 111 will cause the wire-bonding surface of the lead 111 to be twisted and shifted leading to difficulties in wire bonding.

SUMMARY OF THE INVENTION

The main purpose of the present invention is to provide a lead frame to reduce the pulling stresses against a connected lead by downset baffle paddles and to avoid the shifting and twisting of the connected lead when forming downset baffle paddles to improve wire-bonding qualities and die-attaching strengths.

The second purpose of the present invention is to provide a lead frame with downset baffle paddles to keep the die-attaching surface in a good horizontal position to enhance die-attaching strengths between the leads and the chip during die-attaching processes.

According to the present invention, a lead frame is revealed, primarily comprising a plurality of leads, at least a baffle paddle, and an internal tie bar. The leads are formed on the first plane and the baffle paddle is formed on the second plane in parallel so that the baffle paddle is downset. The internal tie bar is formed between the first plane and the second plane and has at least two or more windings to flexibly connect the baffle paddle to an adjacent one of the leads. A semiconductor package utilizing the lead frame is also revealed.

DETAIL DESCRIPTION OF THE INVENTION

Please refer to the attached drawings, the present invention will be described by means of embodiments below.

Figure 1:
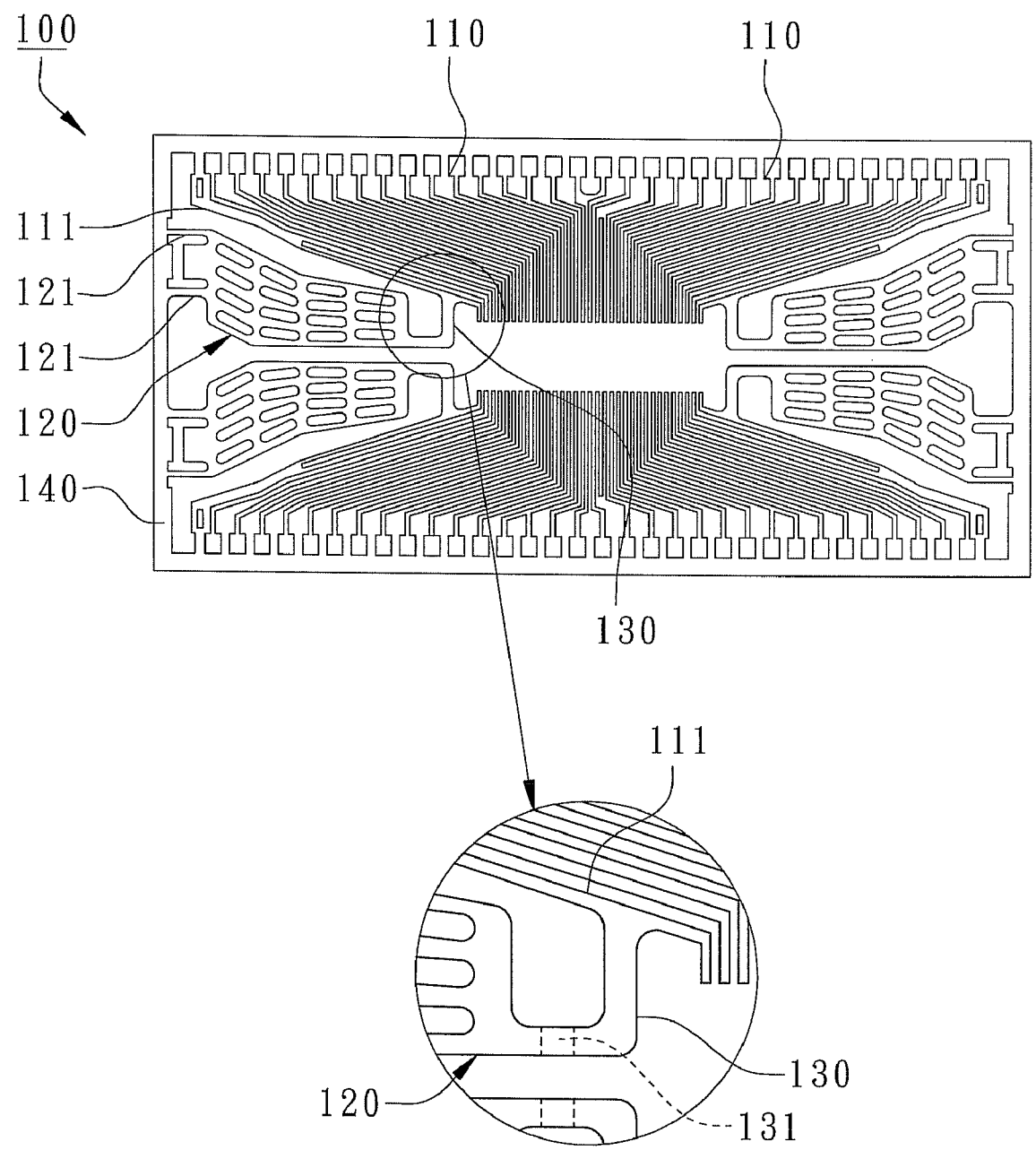
FIG. 1 shows a top view of a conventional lead frame.
Figure 2:
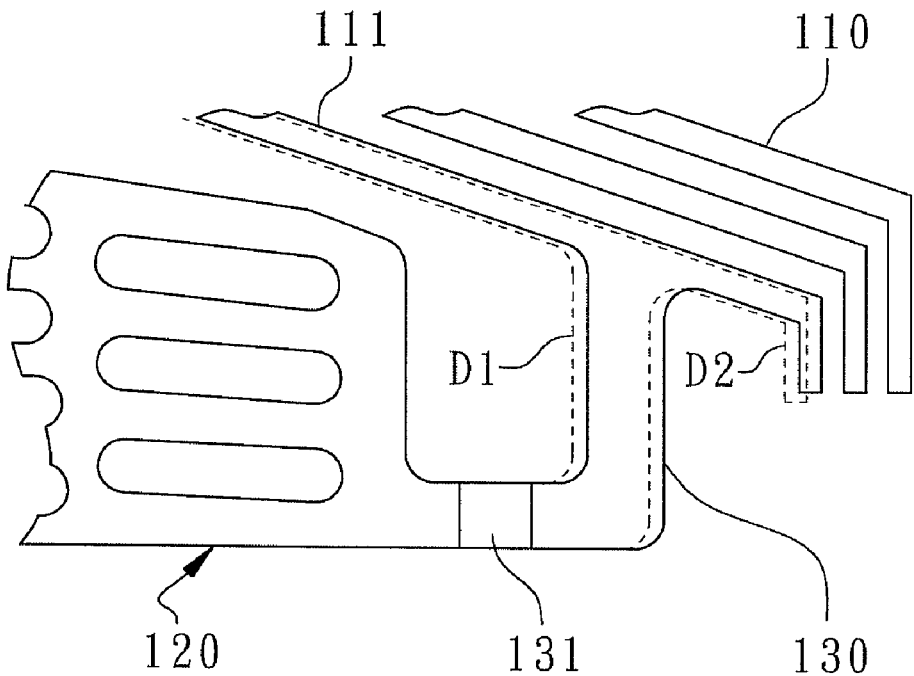
FIG. 2 shows a shifting and twisting diagram of a connected lead during formation of the downset baffle paddle of the conventional lead frame.
Figure 3:
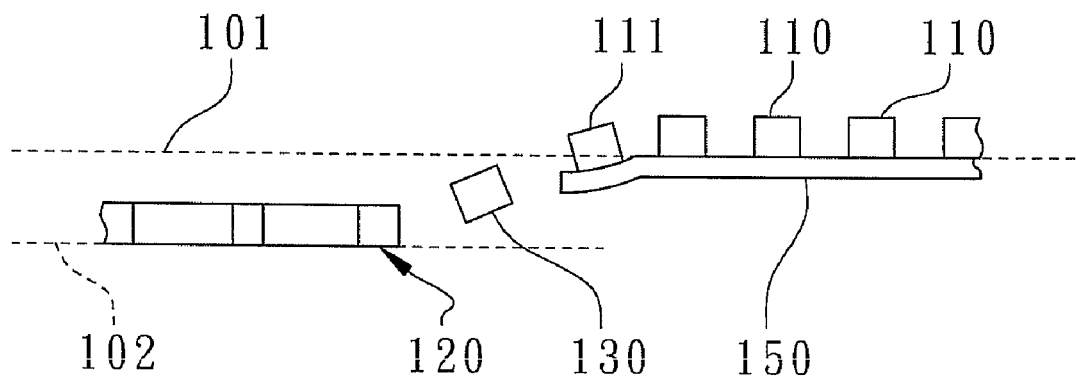
FIG. 3 shows a partial cross-sectional view of the conventional lead frame after the formation of the downset baffle paddle.
Figure 4:
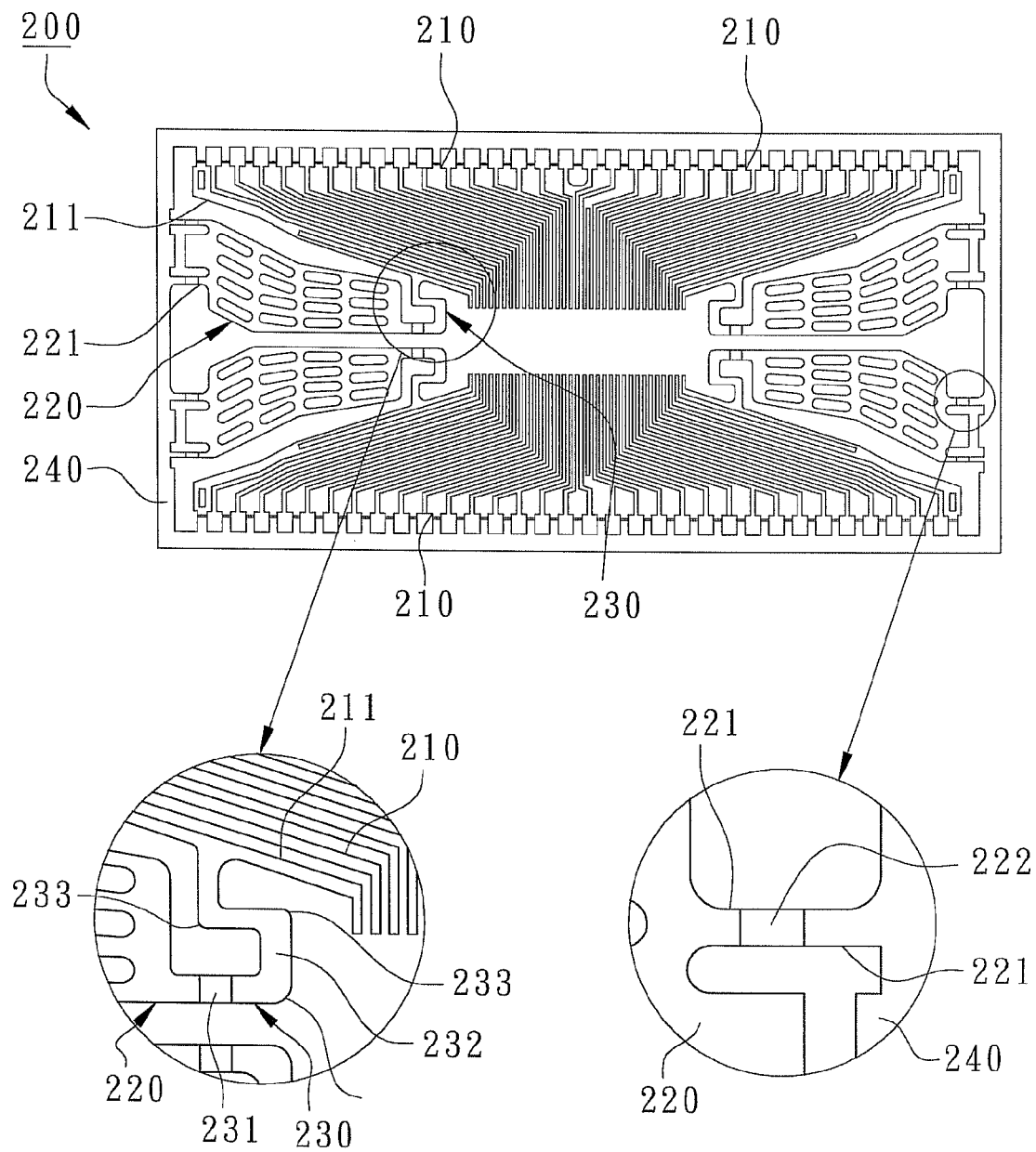
FIG. 4 shows a top view of a lead frame with downset baffle paddles according to the preferred embodiment of the present invention.
Figure 6:
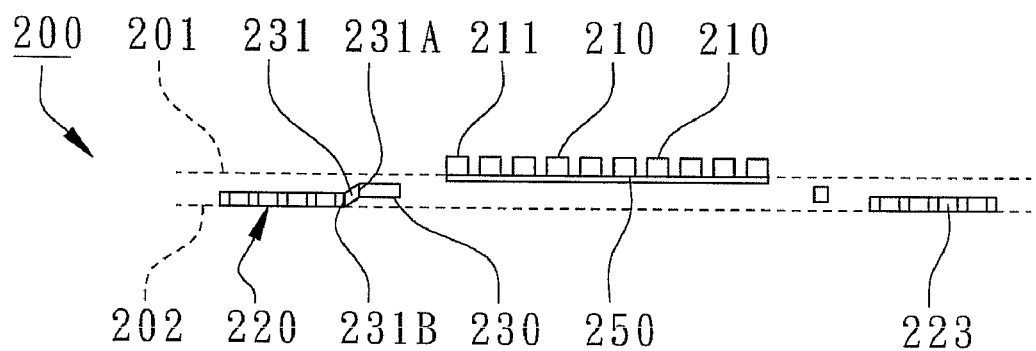
FIG. 6 shows a cross-sectional view of the lead frame after the formation of the downset baffle paddles according to the preferred embodiment of the present invention.

As shown in FIG. 4, a lead frame 200 primarily comprises a plurality of leads 210, at least a baffle paddle 220, and an internal tie bar 230 where the baffle paddle 220 is downset. The materials of the leads 210 can be iron, copper, or other conductive metals. Without limitations, the leads 210 are disposed on two opposing longer sides of the lead frame 200. Two baffle paddles 220 are located on both opposing shorter sides of the lead frame 200 and is connected to an adjacent one of the leads 210 by the internal tie bar 230. As shown in FIG. 4, the one of the leads 210 connected by the internal tie bar 230 is numbered as 211. In this embodiment, the leads 210 extend to a die-bonding area for chip attachment, but the baffle paddles 220 don't extend to the die-bonding area. There is a height difference between the baffle paddle 220 and the leads 210 by pressing the baffle paddle 220 downward to balance the top mold flow and the bottom mold flow. As shown in FIG. 6, the lead frame 200 has a first plane 201 and a second plane 202 in parallel. The leads 210 are formed on the first plane 201 of the lead frame 200 where the leads 210 are disposed on two opposing longer sides of the lead frame 200 with the internal ends of the leads 210 extending toward the center of the die-bonding area to form bonding fingers. As shown in FIG. 6 again, the baffle paddle 220 is formed on the second plane of the lead frame 200 where the baffle paddle 220 has a plurality of through holes 223 to achieve better mold flow. Since the first plane 201 is higher than the second plane 202 so that the baffle paddle 220 is downset designed to balance the top mold flow and the bottom mold flow during encapsulation, such as transfer molding.

Figure 5:
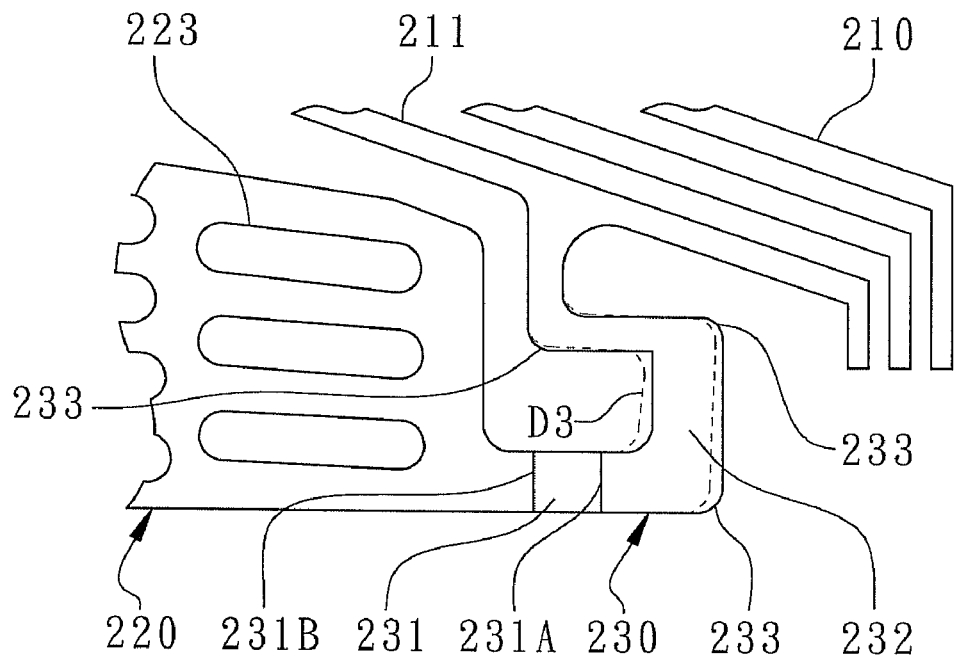
FIG. 5 shows a shifting and twisting diagram of an internal tie bar during the formation of a downset baffle paddle of the lead frame according to the preferred embodiment of the present invention.
Figure 8:
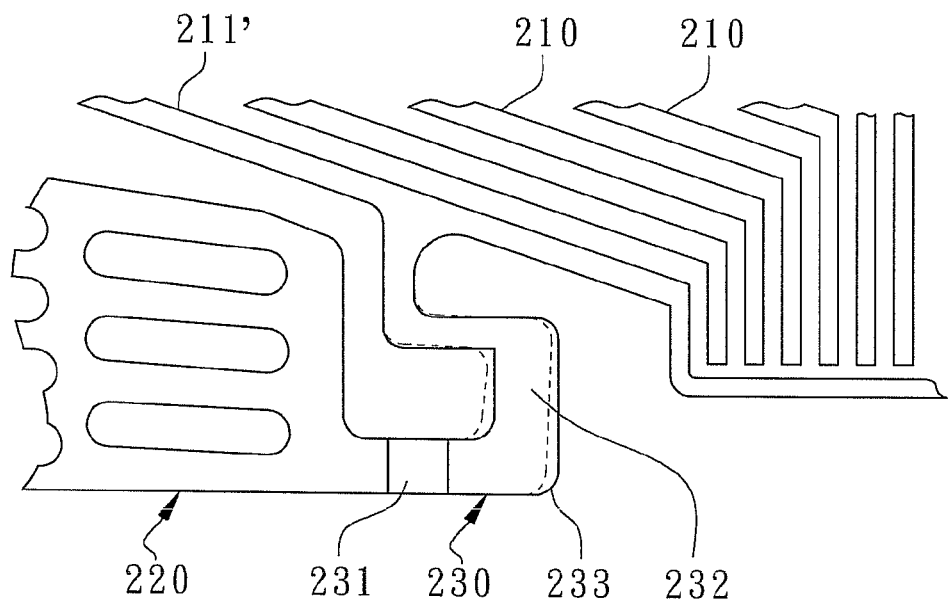
FIG. 8 shows a shifting and twisting diagram of the internal tie bar connecting another type of lead during formation of a downset baffle paddle of the lead frame according to another preferred embodiment of the present invention.

As shown in FIG. 5 and FIG. 6, the internal tie bar 230 is formed between the first plane 201 and the second plane 202 and has at least two or more windings 233 to flexibly connect the baffle paddle 220 to the adjacent lead 211 to reduce the shifting and twisting of the lead 211 during the formation of the downset baffle paddle 220. In one of the embodiment, the internal tie bar 230 can include three windings 233 to form a shape of "S" as shown in FIG. 4. As shown in FIG. 5, the windings 233 of the internal tie bar 230 are three or more to increase flexibility of the internal tie bar 230 where "winding" means that there is an arc or angular bend at sides of the internal tie bar 230, not on the upper or lower surface of the internal tie bar 230. A first downset bend 231 is formed at the end of the internal tie bar 230 connected to the baffle paddle 220 where the first downset bend 231 is bent in not more than 90° or other angles. The "downset bend" means that the baffle paddle 220 is downset by a plurality of creases on upper and lower surfaces of the first downset bend 231 to form on a different plane (the second plane 202) with respect to the internal tie bar 230 and the leads 210. As shown in FIGS. 4 and 5, the lower surface of the first downset bend 231 has a first crease 231A formed between the first plane 201 and the second plane 202 and a second crease 231B formed on the second plane 202. As shown in FIG. 5, the internal tie bar 230 has a U-turn flexible portion 232 including two windings 233 directly connecting the first downset bend 231 to provide proper flexibility. As shown in FIG. 5 again, the U-turn flexible portion 232 has a flexible downward displacement D3 so that the downset of the baffle paddle 230 is formed without shifting nor twisting the connected lead 211 during the formation of the downset of the baffle paddle 220. In another embodiment, as shown in FIG. 8, another type of lead 211' connected to the internal tie bar 230 can be a bus lead for ground/power 19 formed in a shape of a handle.

Figure 7:
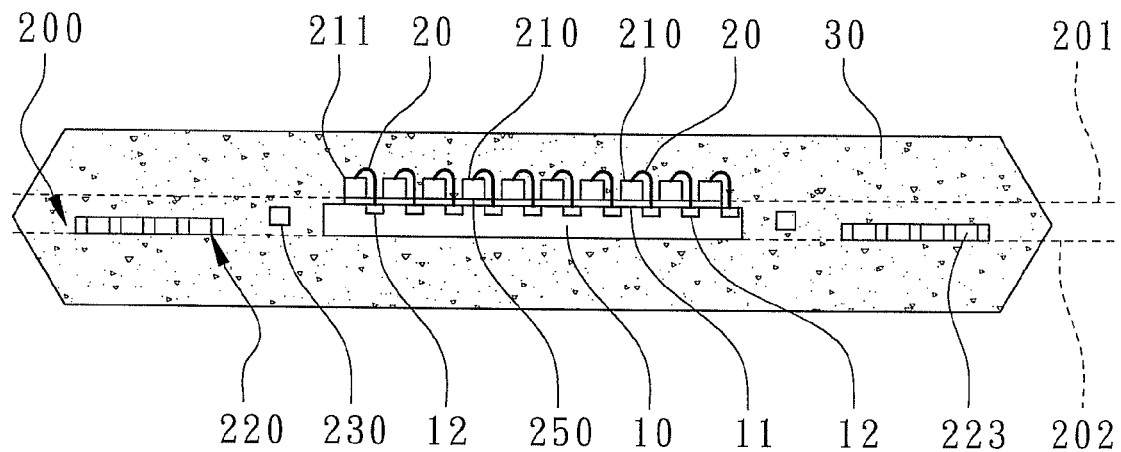
FIG. 7 shows a cross-sectional view of a semiconductor package utilizing the lead frame with downset baffle paddles according to the preferred embodiment of the present invention.

As shown in FIG. 4, the lead frame 200 further comprises a dam frame 240 integrally connecting the leads 210 (including the connected lead 211) and the baffle paddle 220. To be more specific, the baffle paddle 220 is connected to the dam frame 240 by a plurality of external tie bars 221 where each external tie bar 221 includes a second downset bend 222 so that the baffle paddle 220 is downset to form on a different plane relative to the dam frame 240. Since both ends of the external tie bars 221 connect the baffle paddle 220 to the dam frame 240, respectively, the deformation of baffle paddle 221 due to mold flow during encapsulation can be avoided. As shown in FIG. 6, the lead frame 200 further comprises a die-attaching tape 250 for attaching a chip 10, as shown in FIG. 7. The die-attaching tape 250 is attached to the bottom surfaces of the internal ends of the leads 210 including the lead 211 connected to the internal tie bar 230 to form between the first plane 201 and the second plane 202, as shown in FIG. 6. After semiconductor packaging processes, the dam frame 240 is removed from semiconductor packages with cut ends of the external tie bars 221 exposed.

Therefore, by the shape of the internal tie bar 230, the pulling stresses exerted on the connected lead 211 during the formation the downset of the baffle paddle 220 is obviously reduced and the downward shifting and twisting of the connected lead 211 is avoided. The leads 210 including the connected lead 211 are kept in the first plane 201 after the formation the downset of the baffle paddle 220 without shifting nor twisting of the connected lead 211, as shown in FIG. 5 and FIG. 6, so that the die-attaching tape 250 can firmly adhere to the leads 210 including the connected lead 211 horizontally to enhance the die bonding strengths between the chip 10 and the leads 210, 211. Moreover, since the connected lead 211 is free from shifting and twisting, the bonding strengths between the bonding wires and the connected lead 211 are enhanced during wire bonding processes without any wire bonding issues.

According to the present invention, the lead frame 200 can further be implemented in a semiconductor package. As shown in FIG. 7, in addition to comprising the lead frame 200 mentioned above including the leads 210, the baffle paddle 220, a semiconductor package further comprises a chip 10, a plurality of electrical connecting components 20, and an encapsulant 30. A plurality of bonding pads 12 is disposed on the active surface 11 of the chip 10 as external electrodes for the chip 10. The leads 210 including the connected lead 211 are attached to the active surface 11 of the chip 10 by the die-attaching tape 250. The leads 210 including the lead 211 can provide horizontal die-attaching surfaces even after the formation of the baffle paddle 220 due to the design of the internal tie bar 230 so that the die bonding strengths between the leads 210 and the chip 10 are enhanced and the peeling of the chip 10 is also avoided. As shown in FIG. 7, the lead frame 200 is implemented in Lead-On-Chip, LOC, packages without die pads for the chip 10 where the chip 10 is supported by the leads 210 including the connected lead 211. Furthermore, according to the present invention, the lead frame 200 is not only implemented in LOC packages but also in Chip-On-Lead, COL, packages where the backside of the chip is attached to leads. The bonding pads 12 of the chip 10 are electrically connected to the leads 210, 211 by a plurality of electrical connecting components 20. In the present embodiment, the electrical connecting components 20 include a plurality of bonding wires. The encapsulant 30 is formed by transfer molding to encapsulate the chip 20, the electrical connecting components 20, the baffle paddle 220, the internal tie bar 230, and some portions of the leads 210, 211 to avoid external contaminations. In this embodiment, the encapsulant 30 also encapsulates the external tie bars 221 with one cut end of the external tie bars 221 exposed.

The above description of embodiments of this invention is intended to be illustrative and not limiting. Other embodiments of this invention will be obvious to those skilled in the art in view of the above disclosure.

What is claimed is:

1. A lead frame having a first plane and a second plane in parallel, comprising:
   a plurality of leads formed on the first plane;
   at least a baffle paddle formed on the second plane; and an internal tie bar formed between the first plane and the second plane and has at least two or more windings to flexibly connect the baffle paddle to an adjacent one of the leads.

2. The lead frame as claimed in claim 1, wherein the internal tie bar includes three windings to form a shape of "S".

3. The lead frame as claimed in claim 1, wherein one end of the internal tie bar connected to the baffle paddle is a first downset bend.

4. The lead frame as claimed in claim 1, further comprising a dam frame integrally connecting the leads and the baffle paddle.

5. The lead frame as claimed in claim 1, wherein the lead connected with the internal tie bar is a bus lead for ground/power.

6. The lead frame as claimed in claim 1, further comprising a die-attaching tape attached to a plurality of bottom surfaces of the leads to form between the first plane and the second plane.

7. A semiconductor package utilizing the lead frame as claimed in claim 1, further comprising:
 a chip attached to the leads;
 a plurality of electrical connecting components electrically connecting the chip to the leads; and
 an encapsulant encapsulating the chip, the electrical connecting components, the baffle paddle, the internal tie bar, and some portions of the leads.

8. The lead frame as claimed in claim 3, wherein the first downset bend has a first crease formed between the first plane and the second plane and a second crease formed on the second plane.

9. The lead frame as claimed in claim 3, wherein the internal tie bar has a U-turn flexible portion directly connecting to the first downset bend.

10. The lead frame as claimed in claim 4, further comprising a plurality of external tie bars connecting the baffle paddle to the dam frame, wherein each external tie bar includes a second downset bend.

11. The semiconductor package as claimed in claim 7, wherein the electrical connecting components include a plurality of bonding wires.

12. The semiconductor package as claimed in claim 7, wherein the internal tie bar includes three windings to form a shape of "S".

13. The semiconductor package as claimed in claim 7, wherein one end of the internal tie bar connected to the baffle paddle is a first downset bend.

14. The semiconductor package as claimed in claim 7, further comprising a plurality of external tie bars connecting the baffle paddle with one ends exposed from the encapsulant, wherein each external tie bar includes a second downset bend.

15. The semiconductor package as claimed in claim 7, wherein the lead connected with the internal tie bar is a bus lead for ground/power.

16. The semiconductor package as claimed in claim 7, further comprising a die-attaching tape attached to a plurality of bottom surfaces of the leads to form between the first plane and the second plane.

17. The semiconductor package as claimed in claim 13, wherein the first downset bend has a first crease formed between the first plane and the second plane and a second crease formed on the second plane.

18. The semiconductor package as claimed in claim 13, wherein the internal tie bar has a U-turn flexible portion directly connecting to the first downset bend.

* * * * *